(12) United States Patent
Chang

(10) Patent No.: US 7,572,654 B2
(45) Date of Patent: Aug. 11, 2009

(54) METHOD FOR MAKING LIGHT EMITTING DIODE

(75) Inventor: Shao-Han Chang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/610,673

(22) Filed: Dec. 14, 2006

(65) Prior Publication Data
US 2008/0073663 A1  Mar. 27, 2008

(30) Foreign Application Priority Data
Sep. 22, 2006  (CN) .................. 2006 1 0200907

(51) Int. Cl.
*H01L 21/00* (2006.01)
(52) U.S. Cl. .............. 438/29; 362/310; 362/332; 362/555; 362/800; 257/98; 257/99; 438/22; 438/25; 438/26
(58) Field of Classification Search .............. 362/217, 362/308–310, 327, 332, 336–338, 340, 347, 362/555, 800; 257/98–100; 438/22, 25, 438/26, 29

See application file for complete search history.

(56) References Cited

U.S. PATENT DOCUMENTS

| 6,679,621 B2 * | 1/2004 | West et al. .................. 362/327 |
| 6,960,872 B2 * | 11/2005 | Beeson et al. ............... 313/113 |
| 2006/0208269 A1 * | 9/2006 | Kim et al. ..................... 257/98 |

* cited by examiner

*Primary Examiner*—Sandra L O'Shea
*Assistant Examiner*—Meghan K Dunwiddie
(74) *Attorney, Agent, or Firm*—Steven M. Reiss

(57) ABSTRACT

An exemplary light emitting diode (30) includes a light output unit (31), an optical lens (33) and a reflective film (35). The optical lens includes a light input surface (331) facing the light output unit, a top interface (333) opposite to the light input surface, and a light output surface (335) between the light input surface and the top interface. The reflective film is integrally formed on and in immediate contact with the top interface of the optical lens. The reflective film is made of a transparent resin matrix material dispersed with a plurality of reflective particles. A method for making the light emitting diode is also provided.

7 Claims, 4 Drawing Sheets

METHOD FOR MAKING LIGHT EMITTING DIODE

BACKGROUND OF THE INVENTION

1. Field of the Invention

The present invention relates to light emitting diodes; and more particularly to a side-emitting type light emitting diode typically employed by a direct type backlight module of a liquid crystal display, and method for making the light emitting diode.

2. Discussion of the Related Art

In a liquid crystal display device, liquid crystal is a substance that does not itself radiate light. Instead, the liquid crystal relies on light received from a light source in order to provide displaying of images and data. In the case of a typical liquid crystal display device, a backlight module powered by electricity supplies the needed light.

Typically, a light source of a backlight module is one of the following two types: a cold cathode fluorescence lamp (CCFL), or a light emitting diode (LED). Disadvantages of a CCFL include high energy consumption, low optical uniformity, and poor purity of white light. In addition, after being repeatedly used over time, a brightness of the CCFL becomes degraded and a color of light emitted by the CCFL tends to shift. In general, the service life of a CCFL is about 15,000 to 25,000 hours. Furthermore, a CCFL only covers 75 percent of color space as defined by the National Television Standards Committee (NTSC). Therefore, using a CCFL cannot satisfy the requirements for a high quality color liquid crystal display. Unlike CCFLs, high powered LEDs can cover as much as 105 percent of color space as defined by the NTSC. In addition, these LEDs have other advantages such as low energy consumption, long service life, and so on. Therefore, high power LEDs are better suited for producing high quality color liquid crystal displays.

FIG. 4 illustrates a conventional backlight module 10 using a plurality of LEDs 12. The backlight module 10 includes a reflective plate 11, an optical plate 14, and the LEDs 12. The LEDs 12 are regularly arranged on the reflective plate 11. The optical plate 14 is disposed separately above the LEDs 12. Light rays emitted by the LEDs 12 are diffused in the optical plate 14, so that substantially planar light is outputted from the optical plate 14.

Each LED 12 includes a light output unit 121, and an optical lens 123 coupled to the light output unit 121. The optical lens 123 includes a light input surface 1231, a top interface 1233 opposite to the light input surface 1231, and a peripheral light output surface 1235 generally between the light input surface 1231 and the top interface 1233. Light rays emitted by the light output unit 121 enter the optical lens 123 through the light input surface 1231 and transmit to the top interface 1233. Many or most of the light rays undergo total internal reflection at the top interface 1233, and then exit the optical lens 123 through the light output surface 1235.

However, a significant proportion of the light rays still escape from the optical lens 123 through the top interface 1233. This would ordinarily cause a bright area to occur in the optical plate 14 above the LED 12. In order to prevent this problem, the backlight module 10 further includes a transparent plate 13 disposed between the optical plate 14 and the LEDs 12. The transparent plate 13 defines a plurality of reflective layers 15 on a bottom thereof. The reflective layers 15 are positioned in one-to-one correspondence with the LEDs 12. However, precisely positioning the transparent plate 15 according to the LEDs 12 can be very problematic and troublesome, due to the small size of the LEDs 12. In addition, the transparent plate 13 makes the backlight module 10 rather heavy, and adds to manufacturing costs.

What is needed, therefore, is a light emitting diode and method for making the light emitting diode which can overcome the above-described shortcomings.

SUMMARY

A method for making a light emitting diode according to a preferred embodiment includes steps of: mixing a plurality of reflective particles into a plurality of transparent resin particles to attain raw materials; heating and melting the raw materials to form a molten reflective material; and providing a multi-shot injection mold having a first shot cavity for receiving the molten reflective material and a second shot cavity for receiving molten transparent resin material; injection molding the molten reflective material and the molten transparent resin material to produce an optical lens made of transparent resin derived from the molten transparent resin material and having a reflective film derived from the molten reflective material, the reflective film being formed in immediate contact with the top interface; and coupling the product to a light output unit to form a light emitting diode, the light input surface of the optical lens facing the light output unit.

Other advantages and novel features will become more apparent from the following detailed description of the various embodiments, when taken in conjunction with the accompanying drawings.

BRIEF DESCRIPTION OF THE DRAWINGS

The components in the drawings are not necessarily drawn to scale, the emphasis instead being placed upon clearly illustrating the principles of the present light emitting diode and method for making the light emitting diode. Moreover, in the drawings, like reference numerals designate corresponding parts throughout the several views, and all the views are schematic.

DETAILED DESCRIPTION OF THE PREFERRED EMBODIMENTS

Reference will now be made to the drawings to describe preferred embodiments of the present light emitting diode and method for making the light emitting diode, in detail.

Figure 1:
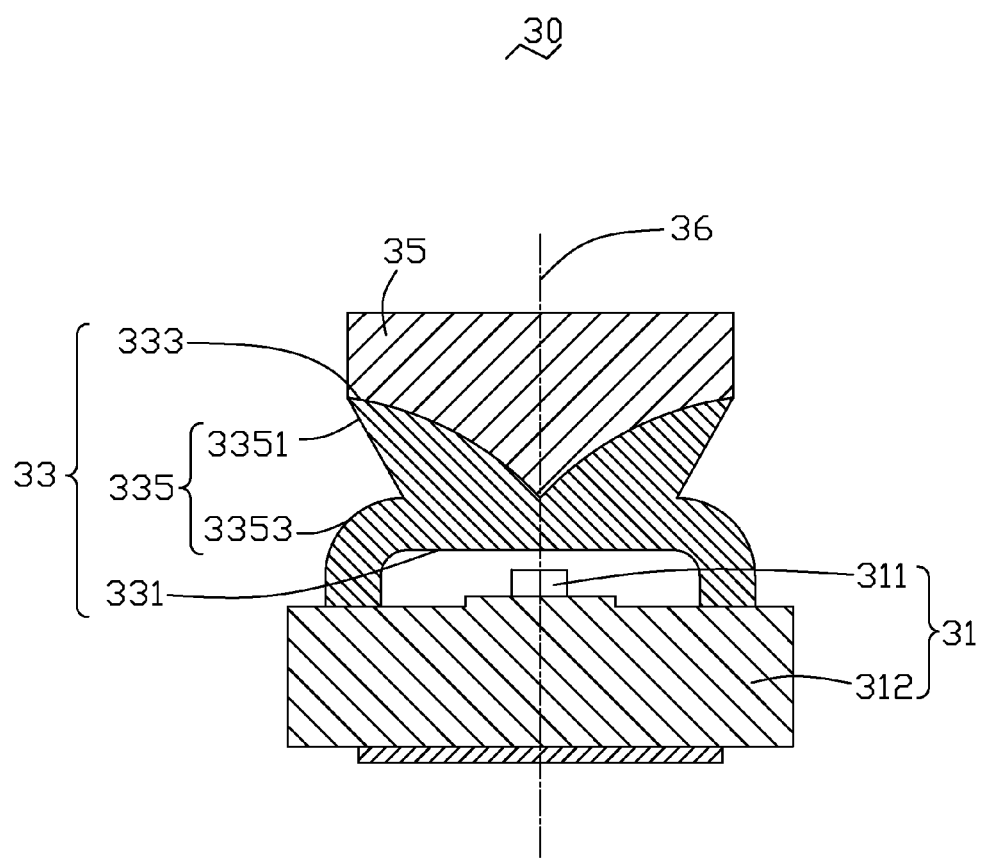
FIG. 1 is a side cross-sectional view of a light emitting diode according to a first preferred embodiment of the present invention.

Referring to FIG. 1, a light emitting diode 30 in accordance with a first preferred embodiment is shown. The light emitting diode 30 includes a light output unit 31, an optical lens 33, and a reflective film 35. The light emitting diode 30 defines a central vertical axis 36 that passes through centers of the light output unit 31 and the optical lens 33. The light output unit 31 includes a base 312, and a semiconductor chip 311 fixed on the base 312. The semiconductor chip 311 has a light emitting PN (P-type silicon, N-type silicon) junction. The optical lens 33 includes a light input surface 331, a top interface 333 opposite to the light input surface 331, and a peripheral light output surface 335 generally between the light input surface 331 and the top interface 333. The light input surface 331 has an inverted, generally U-shaped cross-section taken along the plane passing through the central axis 36. The top interface 333 is somewhat funnel-shaped.

The reflective film 35 is integrally manufactured on the top interface 333 of the optical lens 33 by a multi-shot injection molding method. That is, the reflective film 35 and the optical lens 33 are formed as a single unitary body, with the reflective film 35 adjoining the optical lens 33. In particular, the reflective film 35 is in immediate contact with the top interface 333 of the optical lens 33, with no intervening space or substance therebetween. The reflective film 35 is made of a transparent resin matrix material having a plurality of reflective particles (not shown) dispersed therein. An outer surface (not labeled) of the reflective film 35 opposite to the light input surface 331 is configured to be a flat surface. The optical lens 33 is bonded or snap-fitted onto the base 312 of the light output unit 31. The light input surface 331 faces the semiconductor chip 311, and the light input surface 331 and the base 312 cooperate to completely surround the semiconductor chip 311. Light rays emitted by the light output unit 31 enter the optical lens 33 through the light input surface 331. The light rays transmit to the top interface 333. Many or most of the light rays undergo total internal reflection at the top interface 333. Other light rays that escape through the top interface 333 are reflected back into the optical lens 33 by the reflective film 35. Finally, all the light rays exit the optical lens 33 through the light output surface 335.

The transparent resin matrix material of the reflective film 35 can be selected from the group consisting of acrylate resin, acrylate amino resin, epoxy resin, and any suitable combination thereof. The refractive index of the reflective particles is in the range from about 1.6 to about 2.75. A uniform diameter of the reflective particles is preferably in the range from about 0.01 microns to about 5 microns. The reflective particles may be selected singularly or in combination from the group consisting of titanium dioxide ($TiO_2$) particles, barium sulfate ($BaSO_4$) particles, zinc sulfide (ZnS) particles, zinc oxide (ZnO) particles, antimony oxide ($Sb_2O_3$ or $Sb_2O_5$) particles, and calcium carbonate ($CaCO_3$) particles.

In order to improve light output uniformity, the light output surface 335 can be configured to include a first refractive surface 3351, and a second refractive surface 3353 adjacent to the first refractive surface 3351. In the illustrated embodiment, the first refractive surface 3351 has the shape of a periphery of a frustum. The second refractive surface 3353 has the shape of an outer portion of a flat-topped dome. The first refractive surface 3351 is designed to refract and bend light so that the light exits from the optical lens 33 at angles as close to 90 degrees to the central axis 36 as possible.

Figure 4:
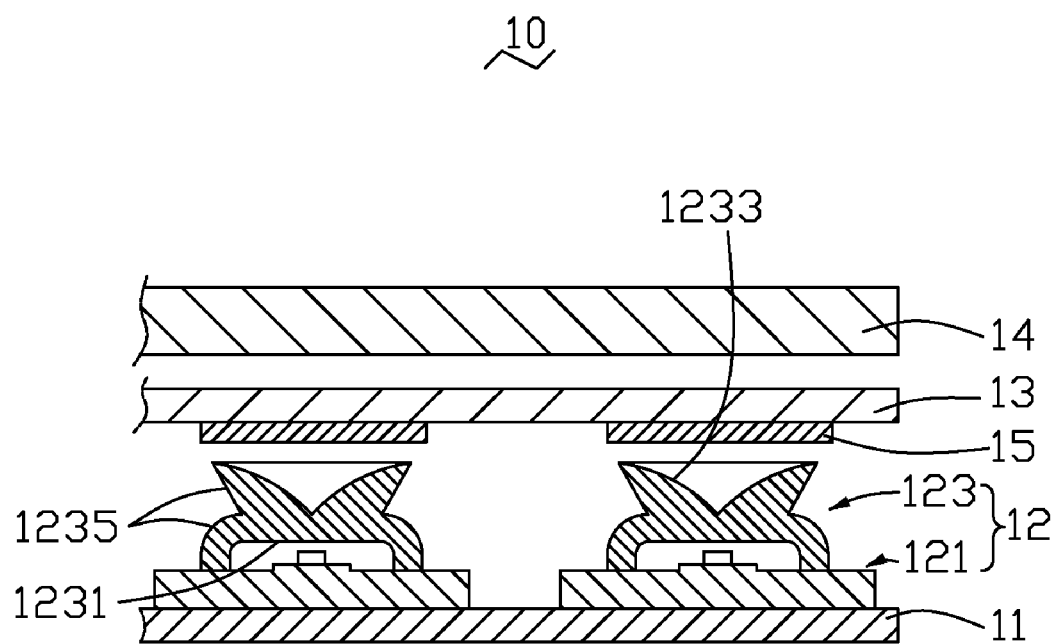
FIG. 4 is an abbreviated, side cross-sectional view of a conventional backlight module having a plurality of light emitting diodes.

The reflective film 35 of the light emitting diode 30 is configured to prevent numerous light transmissions through the top interface 333. Thus, the light emitting diode 30 has relatively more light rays output through the light output surface 335 compared with a similar light emitting diode without the reflective film 35. In addition, when the light emitting diodes 30 are used in a backlight module, a distance from the light emitting diodes 30 to an optical plate of the backlight module may be configured to be very short, with little or no risk of brightness areas occurring in the optical plate due to reduced intensity of light between the adjacent light emitting diodes 30. Furthermore, when compared with the above-described conventional backlight module 10, the backlight module utilizing the light emitting diodes 30 has a relatively lightweight design because a transparent plate such as the transparent plate 13 (shown in FIG. 4) need not be employed.

An exemplary method for making the light emitting diode 30 is provided as follows. Firstly, a plurality of reflective particles and a plurality of transparent resin particles are mixed uniformly to attain a raw material. Secondly, the raw material is heated to form a molten reflective material. Thirdly, a multi-shot injection mold having a first shot cavity and a second shot cavity is provided to produce a multi-component unitary product having an optical lens 33 and a reflective film 35. In particular, the molten reflective material is injected into the first shot cavity, and a molten transparent resin material is injected into the second shot cavity. Finally, the injection molded product is coupled to a light output unit 31 to form the light emitting diode 30.

Figure 2:
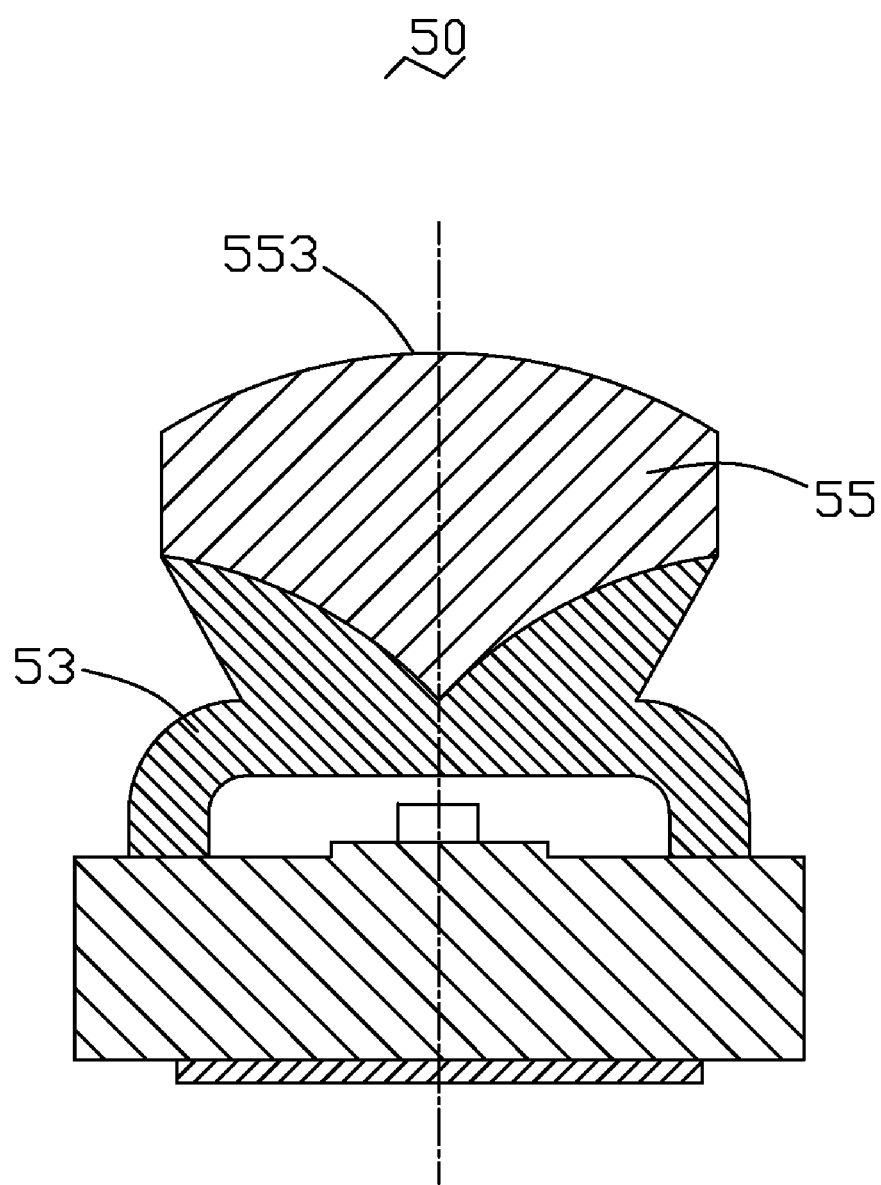
FIG. 2 is a side cross-sectional view of a light emitting diode according to a second preferred embodiment of the present invention.

Referring to FIG. 2, a light emitting diode 50 in accordance with a second preferred embodiment is shown. The light emitting diode 50 is similar in principle to the light emitting diode 30 of the first embodiment, except that a reflective film 55 of the light emitting diode 50 has a spherical-shaped outer surface 553 protruding away from an optical lens 53. A light transmission ratio of the reflective film 55 can be configured by controlling a thickness of the reflective film 55.

Figure 3:
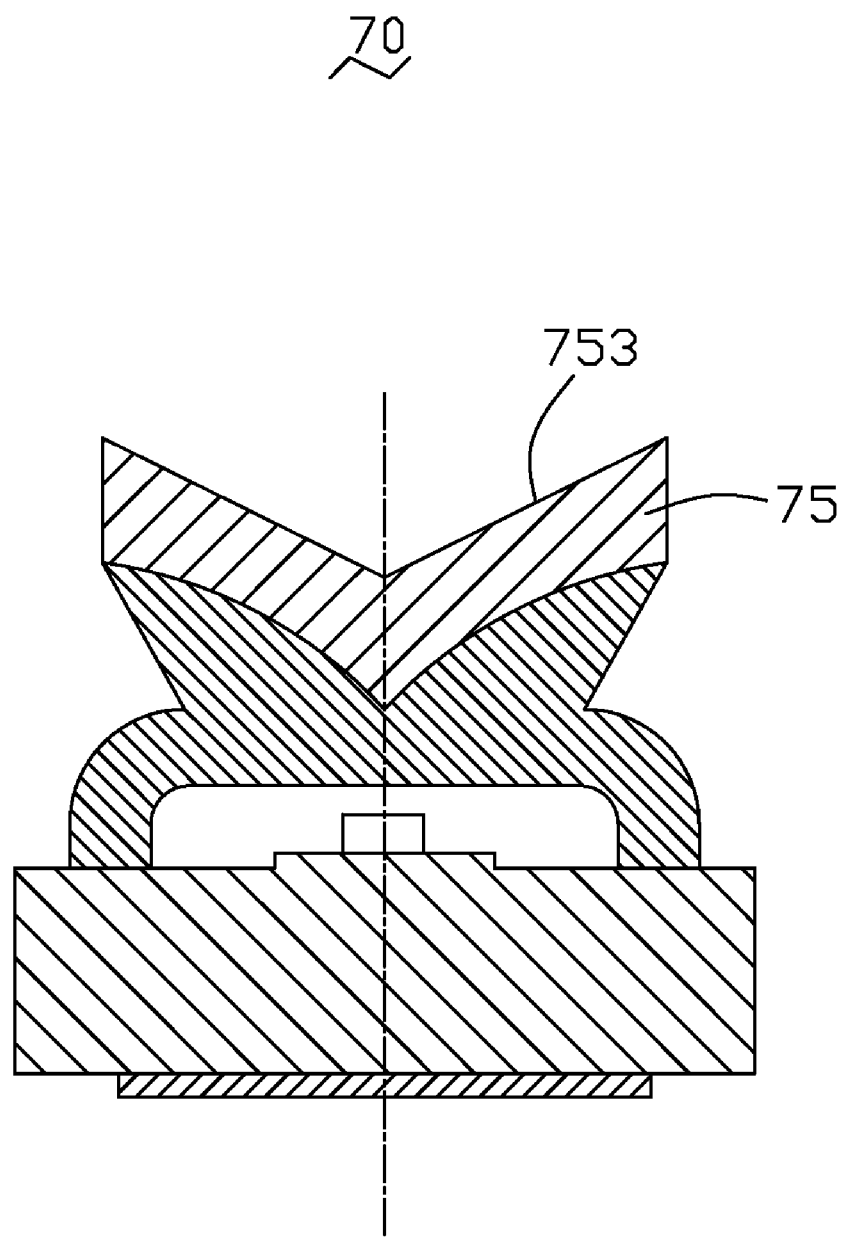
FIG. 3 is a side cross-sectional view of a light emitting diode according to a third preferred embodiment of the present invention.

Referring to FIG. 3, a light emitting diode 70 in accordance with a third preferred embodiment is shown. The light emitting diode 70 is similar in principle to the light emitting diode 30 of the first embodiment, except that a reflective film 75 of the light emitting diode 70 has a funnel-shaped outer surface 753.

It is to be noted that the shape of the optical lens of each light emitting diode is not limited to the shapes described above and illustrated in relation to the preferred embodiments. Other suitable shapes for the optical lens should be considered within the scope of the present disclosure. Further, in any of the above-described embodiments, a ratio by weight of the reflective particles to the transparent resin matrix material can be controlled to obtain a desired light transmission ratio for the reflective film.

Finally, while various embodiments have been described and illustrated, the invention is not to be construed as being limited thereto. Various modifications can be made to the embodiments by those skilled in the art without departing from the true spirit and scope of the invention as defined by the appended claims.

What is claimed is:

1. A method for making a light emitting diode, comprising the steps of:

mixing a plurality of reflective particles into a plurality of transparent resin particles to attain a raw material;

heating and melting the raw material to form a molten reflective material; and providing a multi-shot injection mold having a first shot cavity for receiving the molten reflective material and a second shot cavity for receiving molten transparent resin material;

injection molding the molten reflective material and the molten transparent resin material to produce an optical lens made of transparent resin derived from the molten transparent resin material and having a reflective film derived from the molten reflective material, the optical lens defining a light input surface, a top interface opposite to the light input surface, and a light output surface between the light input surface and the top interface, the reflective film being formed in immediate contact with the top interface; and coupling the optical lens to a light output unit to form a light emitting diode, the light input surface of the optical lens facing the light output unit.

2. The method according to claim 1, wherein a refractive index of the reflective particles is in the range from about 1.6 to about 2.75.

3. The method according to claim 2, wherein the reflective particles are selected from the group consisting of titanium dioxide particles, barium sulfate particles, zinc sulfide particles, zinc oxide particles, antimony oxide particles, calcium carbonate particles and any combination thereof.

4. The method according to claim 1, wherein an outer surface of the reflective film distal from the optical lens is one of a flat surface, a spherical-shaped surface, and a funnel-shaped surface.

5. The method according to claim 1, wherein the light emitting diode defines a central vertical axis that passes through centers of the light output unit and the optical lens, and the light input surface of the optical lens has an inverted U-shaped cross-section taken along a plane passing through the central axis.

6. The method according to claim 1, wherein the top interface is a funnel-shaped.

7. The method according to claim 1, wherein the light output surface comprises a first refractive surface having the shape of a periphery of a frustum, and a second refractive surface adjacent to the first refractive surface, and the second refractive surface has the shape of an outer portion of a flat-topped dome.

* * * * *